(12) United States Patent
Staudinger et al.

(10) Patent No.: US 9,369,089 B2
(45) Date of Patent: Jun. 14, 2016

(54) MULTIPLE-STATE, SWITCH-MODE POWER AMPLIFIER SYSTEMS AND METHODS OF THEIR OPERATION

(71) Applicant: FREESCALE SEMICONDUCTOR, INC., Austin, TX (US)

(72) Inventors: Joseph Staudinger, Gilbert, AZ (US); Hugues Beaulaton, Toulouse (FR); Damon G. Holmes, Scottsdale, AZ (US); Jean-Christophe Nanan, Toulouse (FR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/559,898

(22) Filed: Dec. 3, 2014

(65) Prior Publication Data

US 2015/0155830 A1    Jun. 4, 2015

(30) Foreign Application Priority Data

Dec. 3, 2013   (EP) .................................... 13306660

(51) Int. Cl.
| | | |
|---|---|---|
| *H03F 3/217* | (2006.01) | |
| *H03F 1/02* | (2006.01) | |
| *H03F 3/19* | (2006.01) | |
| *H03F 3/189* | (2006.01) | |
| *H03F 3/21* | (2006.01) | |
| *H03F 3/24* | (2006.01) | |
| *H03F 3/30* | (2006.01) | |

(Continued)

(52) U.S. Cl.
CPC .............. *H03F 1/0205* (2013.01); *H03F 3/189* (2013.01); *H03F 3/19* (2013.01); *H03F 3/211* (2013.01); *H03F 3/2171* (2013.01); *H03F 3/2175* (2013.01); *H03F 3/2176* (2013.01);

(Continued)

(58) Field of Classification Search
CPC ....................................................... H03F 3/217
USPC ........................... 330/251, 207 A, 124 R, 295
See application file for complete search history.

(56) References Cited

U.S. PATENT DOCUMENTS

| | | | |
|---|---|---|---|
| 4,994,760 A | 2/1991 | Roehrs | |
| 2002/0149425 A1* | 10/2002 | Chawla | ................... H03F 3/193 330/251 |

(Continued)

FOREIGN PATENT DOCUMENTS

| | | |
|---|---|---|
| DE | 102011012622 A1 | 8/2012 |
| WO | 2013094265 A1 | 6/2013 |

OTHER PUBLICATIONS

Doherty, W.H., "A New High Efficiency Power Amplifier for Modulated Waves", Technical Papers, Proceedings of the Institute of Radio Engineers, vol. 24, No. 9, Sep. 1936, pp. 1163-1182.

(Continued)

*Primary Examiner* — Patricia T Nguyen
(74) *Attorney, Agent, or Firm* — Sherry W. Schumm

(57) ABSTRACT

An embodiment of an amplifier includes N (N>1) switch-mode power amplifier (SMPA) branches. Each SMPA branch includes two drive signal inputs and one SMPA branch output. A module coupled to the amplifier samples an input RF signal, and produces combinations of drive signals based on the samples. When an SMPA branch receives a first combination of drive signals, it produces an output signal at one voltage level. Conversely, when the SMPA branch receives a different second combination of drive signals, it produces the output signal at another voltage level. At least two of the SMPA branches produce output signals having different absolute magnitudes. A combiner combines the output signals from all of the SMPA branches to produce a combined output signal that may have, at any given time, one of 2*N+1 quantization states.

21 Claims, 7 Drawing Sheets

(51) Int. Cl.
*H03F 3/60* (2006.01)
*H03F 3/72* (2006.01)

(52) U.S. Cl.
CPC ............ *H03F3/2178* (2013.01); *H03F 3/245* (2013.01); *H03F 3/30* (2013.01); *H03F 3/602* (2013.01); *H03F 3/72* (2013.01); *H03F 2200/09* (2013.01); *H03F 2200/171* (2013.01); *H03F 2200/451* (2013.01); *H03F 2200/537* (2013.01); *H03F 2200/541* (2013.01); *H03F 2203/21106* (2013.01); *H03F 2203/21142* (2013.01)

(56) References Cited

U.S. PATENT DOCUMENTS

| | | | | |
|---|---|---|---|---|
| 2003/0102915 | A1* | 6/2003 | Wight | H03F 3/211 330/207 A |
| 2009/0167434 | A1 | 7/2009 | Elmala | |
| 2009/0273397 | A1* | 11/2009 | Bockelman | H03F 1/0277 330/51 |
| 2010/0001796 | A1 | 1/2010 | Sivakumar et al. | |
| 2013/0057343 | A1* | 3/2013 | Kondo | H03F 1/0277 330/252 |
| 2013/0082772 | A1 | 4/2013 | Seddighrad et al. | |
| 2014/0227988 | A1* | 8/2014 | Sato | H06F 1/0277 455/127.3 |
| 2014/0295781 | A1* | 10/2014 | Kawano | H03F 1/0277 455/127.2 |

OTHER PUBLICATIONS

Raab, F.H., "Efficiency of Doherty RF power-amplifier systems", IEEE Transactions on Broadcasting, vol. BC-33, No. 3, Sep. 1987, pp. 77-83.

EP Application 13306660.5 Extended European Search Report, mailed May 28, 2014.

* cited by examiner

*400*

| CONTROL BIT NUMBER | 1 | 2 | 3 | 4 | 5 | 6 | | |
|---|---|---|---|---|---|---|---|---|
| STATE 1 | 1 | 0 | 0 | 0 | 1 | 0 | ⇨ | +3 |
| STATE 2 | 1 | 0 | 1 | 0 | 0 | 0 | ⇨ | +2 |
| STATE 3 | 1 | 0 | 0 | 0 | 0 | 0 | ⇨ | +1 |
| STATE 4 | 0 | 0 | 0 | 0 | 0 | 0 | ⇨ | 0 |
| STATE 5 | 0 | 1 | 0 | 0 | 0 | 0 | ⇨ | -1 |
| STATE 6 | 0 | 1 | 0 | 1 | 0 | 0 | ⇨ | -2 |
| STATE 7 | 0 | 1 | 0 | 0 | 0 | 1 | ⇨ | -3 |

401, 402, 403, 404, 405, 406, 407 label the rows; 411, 412, 413, 414, 415, 416 label the columns.

| CONTROL BIT NUMBER | 1 | 2 | 3 | 4 | 5 | 6 | 7 | 8 | | |
|---|---|---|---|---|---|---|---|---|---|---|
| STATE 1 | 1 | 0 | 1 | 0 | 1 | 0 | 1 | 0 | ⇨ | +4 |
| STATE 2 | 1 | 0 | 1 | 0 | 1 | 0 | 0 | 0 | ⇨ | +3 |
| STATE 3 | 1 | 0 | 1 | 0 | 0 | 0 | 0 | 0 | ⇨ | +2 |
| STATE 4 | 1 | 0 | 0 | 0 | 0 | 0 | 0 | 0 | ⇨ | +1 |
| STATE 5 | 0 | 0 | 0 | 0 | 0 | 0 | 0 | 0 | ⇨ | 0 |
| STATE 6 | 0 | 1 | 0 | 0 | 0 | 0 | 0 | 0 | ⇨ | -1 |
| STATE 7 | 0 | 1 | 0 | 1 | 0 | 0 | 0 | 0 | ⇨ | -2 |
| STATE 8 | 0 | 1 | 0 | 1 | 0 | 1 | 0 | 0 | ⇨ | -3 |
| STATE 9 | 0 | 1 | 0 | 1 | 0 | 1 | 0 | 1 | ⇨ | -4 |

501–509 label the rows; 511–518 label the columns.

FIG. 5

| 900 | CONTROL BIT NUMBER | | | | | | | | |
|---|---|---|---|---|---|---|---|---|---|
| | | 1 | 2 | 3 | 4 | 5 | 6 | 7 | 8 |
| 901 | STATE 1 | 1 | 0 | 1 | 0 | 0 | 0 | 1 | 0 | ⇒ +4 |
| 902 | STATE 2 | 1 | 0 | 1 | 0 | 1 | 0 | 0 | 0 | ⇒ +3 |
| 903 | STATE 3 | 1 | 0 | 1 | 0 | 0 | 0 | 0 | 0 | ⇒ +2 |
| 904 | STATE 4 | 1 | 0 | 0 | 0 | 0 | 0 | 0 | 0 | ⇒ +1 |
| 905 | STATE 5 | 0 | 0 | 0 | 0 | 0 | 0 | 0 | 0 | ⇒ 0 |
| 906 | STATE 6 | 0 | 1 | 0 | 0 | 0 | 0 | 0 | 0 | ⇒ -1 |
| 907 | STATE 7 | 0 | 1 | 0 | 1 | 0 | 0 | 0 | 0 | ⇒ -2 |
| 908 | STATE 8 | 0 | 1 | 0 | 1 | 0 | 1 | 0 | 0 | ⇒ -3 |
| 909 | STATE 9 | 0 | 1 | 0 | 1 | 0 | 0 | 0 | 1 | ⇒ -4 |

MULTIPLE-STATE, SWITCH-MODE POWER AMPLIFIER SYSTEMS AND METHODS OF THEIR OPERATION

TECHNICAL FIELD

Embodiments relate generally to switch-mode power amplifiers and methods of their operation.

BACKGROUND

Wireless radio frequency (RF) communication essentially involves the conversion of digital baseband information into a high-power, modulated RF signal that is suitable for transmission and reception over an air interface. In any RF communication system, the system's power amplifier plays an essential role in amplifying a signal to be communicated prior to provision of the signal to an antenna for transmission. Various common types of power amplifiers are used in RF communications, with the most common types being classified as having analog designs (e.g., classes A, B, AB, and C) or switching designs (e.g., classes D and E).

Power amplifiers tend to consume a significant portion of the total power consumed by a transmission system. Therefore, the power amplifier's efficiency (i.e., the power of the amplifier output signal divided by the total power consumed by the amplifier) is an amplifier quality that designers consistently strive to increase. However, amplifier performance also is important to consider, and many amplifier designs with high theoretical efficiencies may have characteristically lower performance. For example, some classes of amplifiers having relatively high theoretical efficiencies may have relatively poor performance in terms of linearity, distortion, bandwidth, and so on. As there is a great desire to optimize both efficiency and performance in an RF power amplifier, designers of RF power amplifiers continue to strive to develop more efficient and higher performing amplifier designs.

BRIEF DESCRIPTION OF THE DRAWINGS

FIG. 4 is a table illustrating a second example of amplifier control bit codes which, when provided to an embodiment of a three-branch SMPA system, cause the SMPA system to amplitude modulate its output signal to one of seven output voltage levels;

FIG. 5 is a table illustrating an example of amplifier control bit codes which, when provided to an embodiment of a four-branch SMPA system, cause the SMPA system to amplitude modulate its output signal to one of nine output voltage levels;

FIG. 9 is a table illustrating an example of amplifier control bit codes which, when provided to an embodiment of a four-branch SMPA system with two parallel SMPA branches, cause the SMPA system to amplitude modulate its output signal to one of nine output voltage levels with uniform quantization.

DETAILED DESCRIPTION

Embodiments described herein include switch-mode power amplifier (SMPA) systems and methods of their operation, which are configured to amplify a time varying signal, such as a radio frequency (RF) signal. Essentially, the SMPA system embodiments described herein implement an RF digital-to-analog converter (DAC) function. More specifically, the SMPA system embodiments described herein may be particularly suitable for use within a communication system in which an RF signal is oversampled and quantized prior to being encoded in order to drive multiple parallel SMPA branches. Each SMPA branch is configured to convert a direct current (DC) input voltage into an amplified output signal based on the drive signals that are provided to SMPAs (e.g., transistors) of the SMPA branch. The SMPA system further combines the output signals from the multiple SMPA branches in order to produce an output RF signal with a voltage level that may be modulated between a plurality of voltage levels or states. The resulting output RF signal may be reconstructed with a reconstruction filter.

As will be explained in more detail below, the number, N, of SMPA "branches" utilized in the SMPA system defines the number, M, of output signal quantization states. More specifically, the number, M, of output signal quantization states is equal to at least $2*N+1$, in an embodiment. According to various embodiments, N may be any integer greater than 1, although N also (although potentially less usefully) could be as small as 1, as well. For example, when N=2, an embodiment of an SMPA system is capable of producing an output signal having at least 5 distinct quantization states. Similarly, when N=3, an embodiment of an SMPA system is capable of producing an output signal having at least 7 distinct quantization states, when N=4, an embodiment of an SMPA system is capable of producing an output signal having at least 9 distinct quantization states, and so on. The number of SMPA branches may be considered to be arbitrary. A higher number of branches may be advantageous because it may result in higher coding efficiency. However, a system with a higher number of branches would be, by its nature, larger and more complex than a system with a lower number of branches. In any event, the inventive subject matter is intended to include embodiments of a system with any number of SMPA branches.

Figure 1:
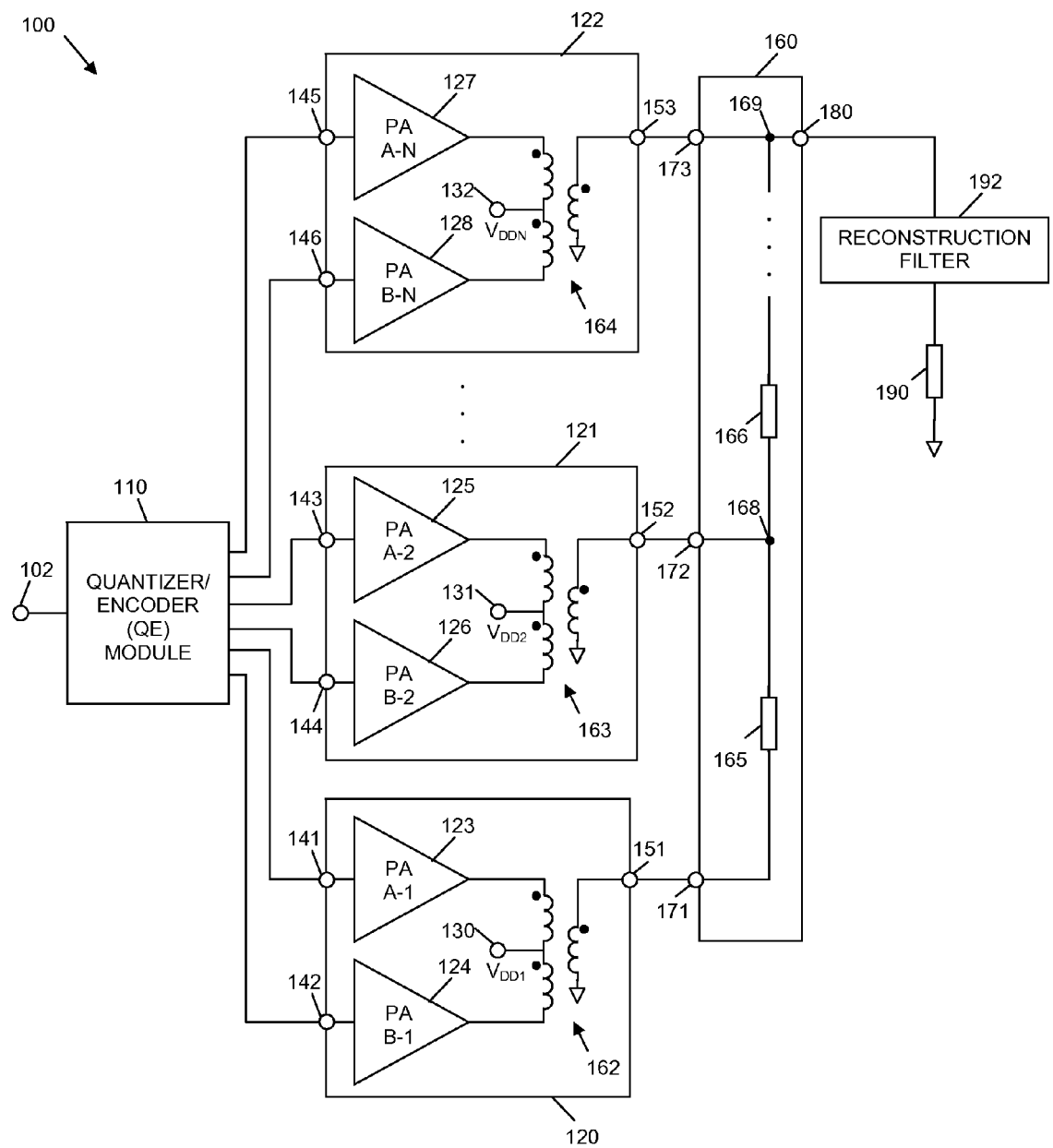
FIG. 1 is a simplified schematic diagram of multiple-state, switch-mode power amplifier (SMPA) system, in accordance with an example embodiment.

FIG. 1 is a simplified schematic diagram of multiple-state SMPA system 100, in accordance with an example embodiment. SMPA system 100 includes a quantizer/encoder (QE) module 110, N SMPA branches 120, 121, 122, an output combiner 160, and a reconstruction filter 192. As will be explained in more detail below, each SMPA branch 120-122 may be implemented in the form of a class-D, push-pull amplifier, in an embodiment. More specifically, the circuit topology of the embodiment of the SMPA branches 120-122 illustrated in FIG. 1 is consistent with a typical voltage-mode class-D amplifier. However, as will be described in more detail below, the input signal drive is different from the conventional input signal drive for a class-D amplifier. Although FIG. 1 illustrates SMPA system 100 as including three SMPA branches 120-122 (N=3), it is to be understood that other embodiments of SMPA systems may include more or less than three SMPA branches. In order to describe a clear example of an embodiment of an SMPA system, FIGS. 1-4 are described in conjunction with a three-branch SMPA system (e.g., SMPA system 100, FIG. 1). However, those of skill in the art would understand, based on the description herein, that N may be any practical integer (e.g., an integer between 2 and 10, inclusive, although N could be greater than 10, as well).

QE module 110 is configured to receive an RF input signal at input node 102, and to sample the signal in order to produce a sequence of samples. For example, QE module 110 may be configured to periodically sample the magnitude of the voltage of the input RF signal, and to produce samples (at a sampling rate) that indicate the measured RF signal magnitudes. Alternatively, QE module 110 may be configured to sample the voltage of the input RF signal. Either way, QE module 110 is essentially configured to sample the input RF signal at the sampling rate. According to an embodiment, the sampling rate is higher than the fundamental frequency of the RF signal. More specifically, the sampling rate is selected to be high enough at least to satisfy the Nyquist sampling criterion. According to a specific embodiment, the sampling rate is about 4 times the fundamental frequency of the RF signal. In alternate embodiments, the sampling rate may be higher or lower (e.g., as low as twice the fundamental frequency). QE module 110 may perform the sampling, for example, using an analog-to-digital converter (ADC), such as a sigma-delta ADC, although other types of ADCs could be used, as well.

According to an embodiment, QE module 110 is further configured to quantize the samples within the sequence of samples in order to produce a sequence of quantized digital values, where the number of quantization states for the quantized digital values corresponds to the number of output signal quantization states (e.g., at least 2*N+1, in an embodiment). QE module 110 is further configured to encode each quantized digital value in order to produce a multi-bit encoded value in which each bit corresponds to a drive signal for a distinct one of the system's power amplifiers (PAs) 123-128. Accordingly, in system 100, which includes three SMPA branches 120-122 and six corresponding PAs 123-128, each encoded value may include at least six bits. The drive signals corresponding to each encoded value are provided substantially in parallel to drive signal inputs 141-146 of SMPA branches 120-122. According to an embodiment, and as will be explained in more detail later, the drive signals may have phase offsets when provided to the drive signal inputs 141-146, in order to compensate for phase shifts later applied by phase transformers 165, 166, and phase shifts arising within the output combiner 160, and the term "substantially in parallel" is intended to reflect that provision of the drive signals may be offset in phase.

Each SMPA branch 120-122 includes a complementary pair of PAs (i.e., pair 123, 124, pair 125, 126, and pair 127, 128). Each of the PAs 123-128 may include, for example, one or more field effect transistors (FETs) (e.g., metal oxide semi-conductor FETs (MOSFETs)) or bipolar transistors. According to an embodiment, the transistors are selected to be enhancement mode types of devices, such as laterally diffused MOS (LDMOS) transistors or pseudomorphic high-electron mobility transistors (pHEMT) transistors. Alternatively, depletion mode types of devices may be used. The devices may be fabricated on silicon, gallium arsenide (GaAs), gallium nitride (GaN), or other types of semiconductor substrates.

Herein, the PAs 123-128 in each pair are distinguished from each other using the designations "A" and "B". Further, the PAs 123-128 in different SMPA branches 120-122 are distinguished from each other herein using the designations "-1", "-2", and "-N". Accordingly, for example, the two PAs 123, 124 of the first PA branch 120 are designated as "PA A-1" 123 and "PA B-1" 124, the two PAs 125, 126 of the second PA branch 121 are designated as "PA A-2" 125 and "PA B-2" 126, and the two PAs 127, 128 of the Nth PA branch 120 are designated as "PA A-N" 127 and "PA B-N" 128. Furthermore, although each PA 123-128 is indicated as including a single amplifier stage, each PA 123-128 may be implemented with multiple serial connected amplifier stages in order to reach a desired output power level (e.g. including a pre-amplifier and a final amplifier), in various embodiments.

According to an embodiment, the PAs 123, 124 in SMPA branch 120 are of equal size, the PAs 125, 126 in SMPA branch 121 are of equal size, and the PAs 127, 128 in SMPA branch 122 are of equal size. However, the sizes of the PAs 123-128 in different SMPA branches 120-122 are different from each other, in an embodiment. For example, the relative size ratios of PAs 123-128 may be as follows: a) $Size_{PA\ A\text{-}1\ 123} = Size_{PA\ B\text{-}1\ 124} = 1$; b) $Size_{PA\ A\text{-}2\ 125} = Size_{PA\ A\text{-}1\ 126} = 2$; and c) $Size_{PA\ A\text{-}N\ 127} = Size_{PA\ B\text{-}2\ 128} = 3/2$. In other words, the PAs 125, 126 in SMPA branch 121 are twice the size of the PAs 123, 124 in SMPA branch 120, and the PAs 127, 128 in SMPA branch 122 are 1.5 times the size of the PAs 123, 124 in SMPA branch 120. In alternate embodiments, the size ratios of the PAs 123-128 may be different from the above given example, or the PAs 123-128 in different SMPA branches 120-122 may be equal in size.

Each PA 123-128 is coupled between one of two drive signal inputs 141-146 and one of two PA output nodes (not labeled) associated with an SMPA branch 120-122. More specifically, as illustrated in FIG. 1, a first SMPA branch 120 includes PA A-1 123 coupled between drive signal input 141 and a first PA output node, and PA B-1 124 coupled between drive signal input 142 and a second PA output node. Similarly, a second SMPA branch 121 includes PA A-2 125 coupled between drive signal input 143 and a third PA output node, and PA B-2 126 coupled between drive signal input 144 and a fourth PA output node. Finally, an Nth (e.g., third) SMPA branch 122 includes PA A-N 127 coupled between drive signal input 145 and a fifth PA output node, and PA B-N 128 coupled between drive signal input 146 and a sixth PA output node.

In addition, each SMPA branch 120-122 receives a DC voltage, $V_{DD}$, through a DC voltage input 130-132. As illustrated in FIG. 1, for example, SMPA branch 120 receives a first DC voltage, $V_{DD1}$, through voltage input 130, SMPA branch 121 receives a second DC voltage $V_{DD2}$, through voltage input 131, and SMPA branch 122 receives an Nth (e.g., third) DC voltage, $V_{DDN}$, through voltage input 132. The magnitudes of the input DC voltages may be substantially equal (e.g., $V_{DD1} = V_{DD2} = \ldots V_{DDN}$), in an embodiment (e.g., as explained later in conjunction with FIGS. 3 and 6), or the magnitudes of the input DC voltages may be different from each other, in other embodiments (e.g., as explained later in conjunction with FIG. 7).

According to an embodiment, each SMPA branch 120-122 has a class D amplifier structure, as illustrated in FIG. 1. More specifically, each SMPA branch 120-122 includes a pair of PAs 123-128, as discussed above, along with a tapped transformer 162, 163, 164 (e.g., a center tapped transformer or balun). According to an embodiment, each transformer 162-164 includes a center-tapped, first coil with a first terminal coupled to the output of a first one of the PAs 123, 125, 127 of each SMPA branch 120-122, and a second terminal coupled to the output of a second one of the PAs 124, 126, 128 of each SMPA branch 120-122. In addition, each transformer 162-164 includes a second coil that is inductively coupled with the first coil, and that includes a first terminal coupled to an SMPA branch output 151, 152, 153 of each SMPA branch 120-122, and a second terminal coupled to a voltage reference (e.g., ground). The turn ratio of each transformer 162-164 is selected to produce a desired output voltage at SMPA branch outputs 151-153. For example, the turn ratio may be 2:1 or some other ratio. In addition, each input DC voltage, $V_{DD1}$, $V_{DD2}$, $V_{DDN}$, supplied to the SMPA branches 120-122 through the voltage inputs 130-132 is provided at the center tap of the first coil of the transformer 162-164, in an embodiment. Alternatively, the input DC voltage may be provided along the first coil at a different tap location.

According to an embodiment, the transistor(s) of each PA 123-128 are not operated in the linear region, but rather are either operated in the saturation region (or switched completely "on") or inactive (or switched completely "off") via the drive signals supplied to the drive signal inputs 141-146. Further, the PAs 123-128 of each SMPA branch 120-122 are operated as a push-pull pair, and the voltage of the output signal produced at each SMPA branch output 151-153 depends upon the states of the drive signals to the PAs 123-128 (i.e., the drive signals provided at drive signal inputs 141-146) and the magnitude of the input DC voltage supplied through the voltage inputs 130-132. More specifically, in an embodiment, PAs 123-128 are driven so that either both PAs in an SMPA branch 120-122 are essentially off, thus producing substantially zero voltage at an SMPA branch output 151-153, or one of the PAs in the SMPA branch 120-122 is essentially off while the other PA in the SMPA branch 120-122 is operating in the saturation region (i.e., completely "on"), thus producing either a positive voltage signal or a negative voltage signal (depending on which PA is being driven) at SMPA branch output 151-153. For example, when one of the "A" PAs (e.g., one of PAs 123, 125, 127) is driven into saturation (while the "B" PA 124, 126, 128 in the pair is not driven), the SMPA branch 120-122 will produce an output signal having a positive normalized voltage. Conversely, when one of the "B" PAs (e.g., one of PAs 124, 126, 128) is driven into saturation (while the "A" PA 123, 125, 126 in the pair is not driven), the SMPA branch 120-122 will produce an output signal having a negative normalized voltage. Finally, when neither the "A" nor "B" PA 121-128 are driven, the SMPA branch 120-122 will produce an output signal having substantially zero voltage.

For ease of description, each drive signal (e.g., the signal provided at one of drive signal inputs 141-146) is described herein as having one of two voltage levels or states at any given time: 1) a first state, $S_{OFF}$, corresponding to a drive signal that will cause a transistor of a PA to which it is supplied to be substantially non-conducting, or fully "off"; and 2) a second state, $S_{ON}$, corresponding to a drive signal that will cause a transistor of a PA to which it is supplied to be operating in the saturation region, or substantially conducting, or fully "on." In addition, the voltage of each output signal (e.g., the voltage of each signal at an SMPA branch output 151-153) may be indicated with a normalized value, which indicates that the voltage is either: 1) substantially zero ("0"); 2) a positive voltage level ("1"); or 3) a negative voltage level ("−1"). Table 1, below, is a truth table indicating combinations of drive signal values supplied to two drive signal inputs (e.g., drive signal inputs 141 and 142) of a single SMPA branch (e.g., SMPA branch 120) and the corresponding normalized voltage output value that would be produced by the SMPA branch at its SMPA branch output (e.g., SMPA branch output 151), according to an embodiment.

TABLE 1

Truth table for SMPA drive signals vs. normalized output voltage

| Drive signal 1 (e.g., at input 141) | Drive signal 2 (e.g., at input 142) | Normalized output voltage (e.g., at output 151) |
|---|---|---|
| $S_{OFF}$ | $S_{OFF}$ | 0 |
| $S_{ON}$ | $S_{OFF}$ | 1 |
| $S_{OFF}$ | $S_{ON}$ | −1 |

As discussed previously, QE module 110 oversamples an input RF signal to produce a sequence of samples, quantizes each sample to produce a sequence of quantized digital values, and encodes each quantized digital value in order to produce a multi-bit encoded value in which each bit corresponds to a drive signal for a distinct one of the system's PAs 123-128. For example, for a six-bit encoded value, a first bit (e.g., the most significant bit (MSB)) may correspond to a drive signal for drive signal input 141 (and thus "A" PA 123), a second bit (e.g., the adjacent bit of lesser significance) may correspond to a drive signal for drive signal input 142 (and thus "B" PA 124), a third bit (e.g., the next adjacent bit of lesser significance) may correspond to a drive signal for drive signal input 143 (and thus "A" PA 125), a fourth bit (e.g., the next adjacent bit of lesser significance) may correspond to a drive signal for drive signal input 144 (and thus "B" PA 126), a fifth bit (e.g., the next adjacent bit of lesser significance) may correspond to a drive signal for drive signal input 145 (and thus "A" PA 127), and a sixth bit (e.g., the least significant bit (LSB)) may correspond to a drive signal for drive signal input 146 (and thus "B" PA 128). Other encoded value bit-to-drive signal mappings may also be used, although the above mapping will be used herein for the purpose of example.

During operation of system 100, the combination of drive signals provided by QE module 110 in parallel to drive signal inputs 141-146 are defined by an encoded value that is next to be processed by the system 100. More specifically, for example, QE module 110 may generate a sample, quantize the sample to produce a quantized digital value, and convert the quantized digital value into a particular encoded value (e.g., a 6-bit value) that corresponds to the magnitude of the quantized digital value. QE module 110 may then generate the drive signals according to the encoded value. For example, when QE module 110 is generating drive signals based on an encoded value of "1 0 1 0 1 0", with the bits corresponding to one of the drive signals provided to drive signal inputs 141-146, the drive signals may have the following states: $S_{ON}$ (drive signal for drive signal input 141); $S_{OFF}$ (drive signal for drive signal input 142); $S_{ON}$ (drive signal for drive signal input 143); $S_{OFF}$ (drive signal for drive signal input 144); $S_{ON}$ (drive signal for drive signal input 145); and $S_{OFF}$ (drive signal for drive signal input 146). Provision of such a combination of drive signals will cause "A" PAs 123, 125, 127 to produce a relatively high voltage output signal, and will result in "B" PAs 124, 126, 128 essentially producing zero voltage output signals.

Although FIG. 1 illustrates a particular class D amplifier topology that may be used in conjunction with the SMPA system 100 illustrated in FIG. 1, those of skill in the art would understand, based on the description herein, that other class D amplifier topologies alternatively could be used. In addition, the SMPA system 100 alternatively may utilize class E amplifier topologies or other types of switching amplifiers.

As discussed previously, SMPA system 100 also includes an output combiner 160. The output combiner 160 includes a plurality of inputs 171, 172, 173, each coupled to one of the SMPA branch outputs 151-153 of the SMPA branches 120-122. The output combiner 160 is configured to combine the signals received from the SMPA branches 120-122 via the SMPA branch outputs 151-153 and combiner inputs 171-173, in order to produce a combined output signal at output 180. The combined output signal is provided to reconstruction filter 192, in an embodiment, which includes a band-pass filter configured to bandlimit the combined output signal (e.g., to produce a smoother output analog RF signal by filtering out the out-of-band spectral content). When the reconstruction filter 192 is coupled to a load 190, as shown in FIG. 1, the reconstructed output signal produced by the reconstruction filter 192 is provided to the load 190.

According to an embodiment, output combiner 160 includes a number of summing nodes 168, 169 and a number of phase transformers 165, 166, which may be coupled to the combiner inputs 171-173 as indicated in FIG. 1. For example, the number of summing nodes 168, 169 may equal N-1, and the number of phase transformers 165, 166 may equal N-1, although the number of summing nodes 168, 169 and/or phase transformers 165, 166 may be different, in other embodiments. In the illustrated embodiment, the first SMPA branch 120 is coupled (via output 151 and input 171) to a first terminal of a first phase transformer 165, the second SMPA branch 121 is coupled (via output 152 and input 172) to summing node 168, a second terminal of the first phase transformer 165, and a first terminal of a second phase transformer 166, and the Nth (e.g., third) SMPA branch 122 is coupled (via output 153 and input 173) to summing node 169 and a second terminal of the second phase transformer 166. Further, summing node 169 is coupled to output 180.

Phase transformers 165, 166 may be quarter wave (lambda/4) phase transformers, for example. Accordingly, each phase transformer 165, 166 may introduce a 90 degree phase delay to a signal received at its first terminal. In other embodiments, phase transformers 165, 166 may be configured to introduce larger or smaller phase delays. In addition to producing a phase shift, phase transformers 165, 166 may also be configured to produce impedance transformations between input 171 and summing node 168, and between summing nodes 168 and 169, respectively. Either way, the phasing of the drive signals provided to the SMPA branches 120-122 at drive signal inputs 141-146 is controlled so that signals received at summing nodes 168, 169 from different SMPA branches 120-122 will be added together in phase. For example, in an embodiment in which phase transformers 165, 166 are quarter wave transformers, QE module 110 provides drive signals corresponding to a particular encoded value (or to a particular sample or quantized digital value) to SMPA branch 120 90 degrees ahead of the drive signals provided to SMPA branch 121, and 180 degrees ahead of drive signals provided to SMPA branch 122. Accordingly, the output signal from SMPA branch 120 will be delayed by phase transformer 165 by 90 degrees, thus allowing that output signal to arrive at summing node 168 in phase with the output signal from SMPA branch 121. The combined signal at summing node 168 is again delayed by phase transformer 166 by another 90 degrees, thus allowing the combined signal from summing node 168 to arrive at summing node 169 in phase with the output signal from SMPA branch 122. In this manner, the output signals from all of the SMPA branches 120-122 ultimately are combined in phase with each other.

As will now be described in detail, embodiments of an SMPA system, such as SMPA system 100 described above, may be operated so that the SMPA system is capable of producing an output signal (e.g., at output 180) with a voltage level that may be modulated between a plurality of voltage levels or states. For example, in an SMPA system with N SMPA branches, the number, M, of output signal quantization states is equal to at least 2*N+1, in an embodiment. Each output quantization state corresponds to a different set of drive signals and, thus, to a different set of encoded values. In other words, according to an embodiment, a QE module (e.g., QE module 110) is configured to quantize each sample and thereafter encode each quantized digital value to one of M encoded values, and each of the M encoded values, when converted to drive signals, corresponds to production of an output signal (e.g., at output 180) having one of M output signal quantization states.

Figures 2, 3:
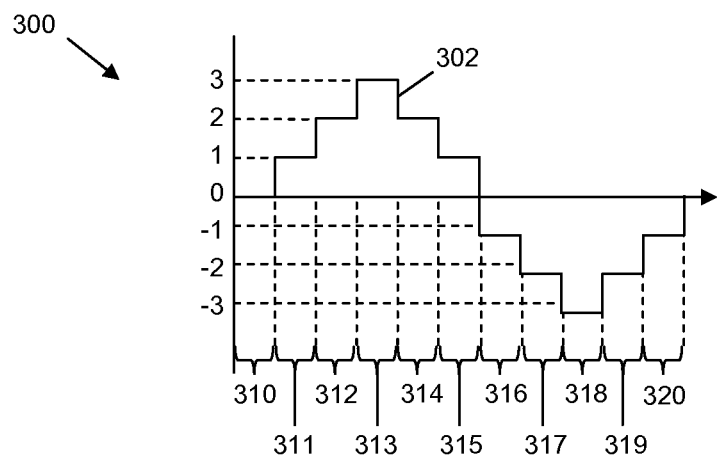
FIG. 2 is a table illustrating a first example of amplifier control bit codes which, when provided to an embodiment of a three-branch SMPA system, cause the SMPA system to amplitude modulate its output signal to one of seven output voltage levels.
FIG. 3 is a chart illustrating seven example output voltage levels for a three-branch SMPA system that implements uniform quantization, in accordance with an example embodiment.

For example, FIGS. 2-4 correspond to systems with three SMPA branches (i.e., N=3) which are configured to produce output signals having any one of seven output quantization states (i.e., M=2*3+1=7). More specifically, FIG. 2 is a table 200 illustrating a first example of amplifier control bit codes which, when implemented in an embodiment of a three-branch SMPA system with six PAs, cause the SMPA system to amplitude modulate its output signal to one of seven output voltage levels or states.

Table 200 includes seven rows 201, 202, 203, 204, 205, 206, 207, where each row corresponds to one of seven quantization states (e.g., quantization states ranging from values of −3 to +3 in step sizes of 1). In addition, the table 200 includes six columns 211, 212, 213, 214, 215, 216, where each column corresponds to one bit of a six-bit encoded value, and the value of each bit determines the state of a drive signal that will be provided to one of the six PAs of the system. Said another way, each bit position of an encoded value corresponds to a different one of the six PAs, and the value of the bit in that bit position defines the drive signal that the QE module will provide to the corresponding PA. By way of example, column 211 may correspond to PA 123, column 212 may correspond to PA 124, column 213 may correspond to PA 125, column 214 may correspond to PA 126, column 215 may correspond to PA 127, and column 216 may correspond to PA 128.

In the example embodiments provided herein, the least significant bits of each encoded value (i.e., control bits 1 and 2 in Table 2) correspond to the PAs that are electrically farthest from the output node (e.g., output 180), and the most significant bits of each encoded value (i.e., control bits 5 and 6 in Table 2) correspond to the PAs that are electrically closest to the output node. Further, in the example embodiments provided herein, odd numbered control bits correspond to "A" PAs (e.g., PAs 123, 125, 127), and even numbered control bits correspond to "B" PAs (e.g., PAs 124, 126, 128). Those of skill in the art would understand, based on the description herein, that the mapping of bits in an encoded value to PAs of a system may be different from the example mappings provided herein, and such alternative mappings are intended to be included within the scope of the inventive subject matter.

In any event, referring to FIG. 2, each row 201-207 includes one of seven unique encoded values, and each of the encoded values, when selected by the QE module and used to produce drive signals for the PAs, will cause the system to produce an output signal (e.g., at output 180) having one of seven different normalized voltage levels or states. For example, in table 200, encoded value "1 0 1 0 1 0" in row 201 may correspond to a highest quantization state (e.g., a positive voltage level of +3), encoded value "1 0 1 0 0 0" in row 202 may correspond to a next highest quantization state (e.g., a positive voltage level of +2), encoded value "1 0 0 0 0 0" in row 203 may correspond to a next highest quantization state (e.g., a positive voltage level of +1), encoded value "0 0 0 0 0 0" in row 204 may correspond to a neutral or zero quantization state, encoded value "0 1 0 0 0 0" in row 205 may correspond to a next lowest quantization state (e.g., a negative voltage level of –1), encoded value "0 1 0 1 0 0" in row 206 may correspond to a next lowest quantization state (e.g., a negative voltage level of –2), and encoded value "0 1 0 1 0 1" in row 207 may correspond to the lowest quantization state (e.g., a negative voltage level of –3).

As mentioned previously, a QE module periodically samples an input RF signal (e.g., a signal received at input 102) to produce a sequence of samples that are indicative of the voltage of the RF signal at each of the sampling times. The QE module further quantizes each sample to produce a corresponding quantized digital value, and selects an encoded value (e.g., one of the encoded values in table 200) corresponding to each quantized digital value. For example, the encoded value in row 201 may be selected for one or more first quantized digital values (e.g., corresponding to samples falling within a first, highest range of magnitudes), the encoded value in row 202 may be selected for one or more second quantized digital values (e.g., corresponding to samples falling within a lower adjacent range of magnitudes), and so on.

After an encoded value has been selected, it may be converted into drive signals for driving the system's PAs. For example, each "0" in an encoded value may correspond to a drive signal having a magnitude of $S_{OFF}$, and each "1" in an encoded value may correspond to a drive signal having a magnitude of $S_{ON}$. The QE module may then provide the drive signals to the corresponding PAs (e.g., in a phased manner, as discussed previously). For example, when the encoded value in row 201 is selected, the QE module may convert the encoded value of "1 0 1 0 1 0" into drive signals having magnitudes of $S_{ON}$ (to drive PA 123), $S_{OFF}$ (to drive PA 124), $S_{ON}$ (to drive PA 125), $S_{OFF}$ (to drive PA 126), $S_{ON}$ (to drive PA 127), and $S_{OFF}$ (to drive PA 128).

According to an embodiment, SMPA system 100 may implement uniform quantization, meaning that an equal voltage difference exists between any two adjacent quantization states (e.g., a normalized value of 1). To implement uniform quantization in an embodiment of a system that uses encoded values such as those illustrated in FIG. 2, when any one of the "A" PAs (e.g., PAs 123, 125, 127) is provided with a drive signal with a state of $S_{ON}$ (while the corresponding "B" PA is provided with a drive signal with a state of $S_{OFF}$), the "A" PA will produce a signal that results in an output signal from its SMPA branch having a normalized voltage magnitude of +1. Conversely, when any one of the "B" PAs (e.g., PAs 124, 126, 128) is provided with a drive signal with a state of $S_{ON}$ (while the corresponding "A" PA is provided with a drive signal with a state of $S_{OFF}$), the "B" PA will produce a signal that results in an output signal from its SMPA branch having a normalized voltage magnitude of –1. Accordingly, when the PAs are driven with the drive signals corresponding to the encoded value in row 201, as listed above, each of the "A" PAs (e.g., PAs 123, 125, 127) will produce a signal that results in an output signal from its SMPA branch having a normalized voltage magnitude of +1, and the combiner network (e.g., output combiner 160) will sum the output signals in phase to produced a combined output signal (e.g., at output 180) having a normalized voltage magnitude of +3. Conversely, if the PAs are driven with the drive signals corresponding to the encoded value in row 207 (i.e., drive signals $S_{OFF}$ (to drive PA 123), $S_{ON}$ (to drive PA 124), $S_{OFF}$ (to drive PA 125), $S_{ON}$ (to drive PA 126), $S_{OFF}$ (to drive PA 127), and $S_{ON}$ (to drive PA 128)), each of the "B" PAs (e.g., PAs 124, 126, 128) will produce a signal that results in an output signal from its SMPA branch having a normalized voltage magnitude of –1, and the combiner network will sum the output signals to produced a combined output signal (e.g., at output 180) having a normalized voltage magnitude of –3.

FIG. 3 is a chart 300 illustrating seven example output voltage levels for a three-branch SMPA system that implements uniform quantization, in accordance with an example embodiment. In chart 300, the vertical axis represents voltage level (normalized), and the horizontal axis represents time. In keeping with the previous example, the chart 300 depicts a varying magnitude of an output signal (e.g., at output 180) when a particular sequence of encoded values (e.g., a sequence of values from the encoded values of FIG. 2) is selected by a QE module. Referring to both FIGS. 2 and 3, trace 302 of chart 300 depicts the magnitude of the output signal (e.g., at output 180) when a QE module (e.g., QE module 110) converts the sequence of encoded values in the following table into drive signals that are provided to SMPA branches (e.g., SMPA branches 120-122), each SMPA branch produces a corresponding output signal, and a combiner (e.g., combiner 160) combines the output signals to produce a combined output signal (e.g., at output 180):

| time period (FIG. 3) | row/encoded value (FIG. 2) | normalized output voltage |
|---|---|---|
| 310 | 204/0 0 0 0 0 0 | 0 |
| 311 | 203/1 0 0 0 0 0 | 1 |
| 312 | 202/1 0 1 0 0 0 | 2 |
| 313 | 201/1 0 1 0 1 0 | 3 |
| 314 | 202/1 0 1 0 0 0 | 2 |
| 315 | 203/1 0 0 0 0 0 | 1 |
| 316 | 205/0 1 0 0 0 0 | –1 |
| 317 | 206/0 1 0 1 0 0 | –2 |
| 318 | 207/0 1 0 1 0 1 | –3 |
| 319 | 206/0 1 0 1 0 0 | –2 |
| 320 | 205/0 1 0 0 0 0 | –1 |

In the above given example, uniform quantization is achieved in a system in which the output voltage at output 180 increases or decreases uniformly (e.g., in uniform step sizes of 1 volt normalized) per the operation described in table 200 (FIG. 2) when changing the input coding from one row to an adjacent row. For example, changing the input coding from row 203 to adjacent row 202 results in an increase of 1 volt normalized at output 180, and changing the input coding from row 203 to adjacent row 204 results in a decrease of 1 volt normalized at output 180. In an alternate embodiment, uniform quantization may be achieved in a system in which other combinations of the SMPA branches may contribute to the output signal (e.g., at output 180). More specifically, in such an embodiment, different combinations of SMPA branches may be driven to achieve the various voltage levels. Accordingly, in such an embodiment, different encoded values could be implemented to achieve the same results that were achievable using the encoded values from FIG. 2.

For example, in an embodiment of SMPA system 100, SMPA branches 120 and 121 each may be configured to produce output signals having normalized voltage levels of +1, 0, and −1, and SMPA branch 122 may be configured to produce output signals having normalized voltage levels of +2, 0, and −2. In such an embodiment, the system may implement different encoded values (and correspondingly different sets of drive signals) from those of FIG. 2 in order to produce output signals with uniform quantization. For example, FIG. 4 is a table 400 illustrating a second example of amplifier control bit codes which, when provided to an embodiment of a three-branch SMPA system in which one SMPA branch (e.g., SMPA branch 121) does not contribute power in producing a +/−3 output state at output 180, and in which this difference is compensated by higher contributions from SMPA branches 120 and 122, thus causing the SMPA system to amplitude modulate its output signal to one of seven output voltage levels with uniform quantization.

Similar to table 200, table 400 includes seven rows 401, 402, 403, 404, 405, 406, 407, where each row corresponds to one of seven quantization states (e.g., quantization states ranging from values of −3 to +3 in step sizes of 1). In addition, the table 400 includes six columns 411, 412, 413, 414, 415, 416, where each column corresponds to one bit of a six-bit encoded value, and the value of each bit determines the state of a drive signal that will be provided to one of the six PAs of the system. In addition, each row 401-407 includes one of seven unique encoded values, and each of the encoded values, when selected by a QE module, will cause the system to produce an output signal having one of seven different normalized voltage levels or states. For example, in table 400, encoded value "1 0 0 0 1 0" in row 401 may correspond to a highest quantization state (e.g., a positive voltage level of +3), encoded value "1 0 1 0 0 0" in row 402 may correspond to a next highest quantization state (e.g., a positive voltage level of +2), encoded value "1 0 0 0 0 0" in row 403 may correspond to a next highest quantization state (e.g., a positive voltage level of +1), encoded value "0 0 0 0 0 0" in row 404 may correspond to a neutral or zero quantization state, encoded value "0 1 0 0 0 0" in row 405 may correspond to a next lowest quantization state (e.g., a negative voltage level of −1), encoded value "0 1 0 1 0 0" in row 406 may correspond to a next lowest quantization state (e.g., a negative voltage level of −2), and encoded value "0 1 0 0 0 1" in row 407 may correspond to the lowest quantization state (e.g., a negative voltage level of −3). Essentially, the only difference between tables 200 and 400 are the encoded values that correspond to the highest and lowest voltage level states (i.e., states 1 and 7). Because two of the SMPA branches (e.g., SMPA branches 120 and 122) are capable of producing additional power when SMPA branch 121 is off, it is possible to achieve the highest and lowest voltage level states without activating all three SMPA branches in parallel.

The encoded values in tables 200 and 400 are provided as examples only. Those of skill in the art would understand, based on the description herein, how to generate sets of encoded values that may be used in conjunction with various embodiments of SMPA systems in order to produce output signals having uniformly quantized output quantization states. In addition, those of skill in the art would understand, based on the description herein, how to generate sets of encoded values that may be used in conjunction with SMPA systems with more or fewer than three SMPA branches (e.g., SMPA systems that may produce output signals with more or fewer than seven states). For example, an embodiment of an SMPA system with four SMPA branches (i.e., N=4) may be capable of producing an output signal with at least nine voltage quantization states (i.e., M=2*4+1=9). In such an embodiment, a set of encoded values may include nine different eight-bit values in order to implement the nine different quantization states.

FIG. 5 is a table 500 illustrating an example of amplifier control bit codes which, when provided to an embodiment of a four-branch SMPA system with eight PAs, cause the SMPA system to amplitude modulate its output signal to one of nine output voltage levels. Table 500 includes nine rows 501, 502, 503, 504, 505, 506, 507, 508, 509, where each row corresponds to one of nine quantization states (e.g., quantization states ranging from values of −4 to +4 in step sizes of 1). In addition, the table 500 includes eight columns 511, 512, 513, 514, 515, 516, 517, 518, where each column corresponds to one bit of an eight-bit encoded value, and the value of each bit determines the state of a drive signal that will be provided to one of the eight PAs of the system. Each row 501-509 includes one of nine unique encoded values, and each of the encoded values, when selected by a QE module (e.g., QE module 110), will cause the system to produce an output signal having one of nine different normalized voltage levels or states. For example, in table 500, encoded value "1 0 1 0 1 0 1 0" in row 501 may correspond to a highest quantization state (e.g., a positive voltage level of +4), encoded value "1 0 1 0 1 0 0 0" in row 502 may correspond to a next highest quantization state (e.g., a positive voltage level of +3), and so on.

Figure 6:
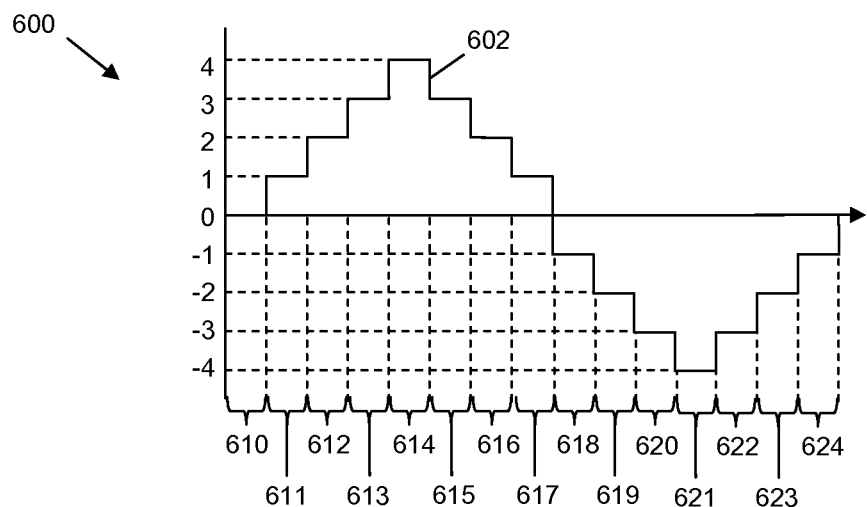
FIG. 6 is a chart illustrating nine example output voltage levels for a four-branch SMPA system that implements uniform quantization, in accordance with an example embodiment.

According to an embodiment, uniform quantization may be achieved using the encoded values in table 500. For example, FIG. 6 is a chart 600 illustrating nine example output voltage levels for a four-branch SMPA system that implements uniform quantization, in accordance with an example embodiment. In chart 600, the vertical axis represents voltage level (normalized), and the horizontal axis represents time. Similar to chart 300, chart 600 depicts a varying magnitude of an output signal (e.g., at output 180) when a particular sequence of encoded values (e.g., a sequence of values from the encoded values of FIG. 5) is selected by a QE module. Referring also to FIG. 5, trace 602 of chart 600 depicts the magnitude of the output signal (e.g., at output 180) when a QE module (e.g., QE module 110) converts the sequence of encoded values in the following table into drive signals that are provided to SMPA branches (e.g., SMPA branches 120-122 when N=4), each SMPA branch produces a corresponding output signal, and a combiner (e.g., combiner 160) combines the output signals to produce a combined output signal (e.g., at output 180):

| time period (FIG. 6) | row/encoded value (FIG. 5) | normalized output voltage |
|---|---|---|
| 610 | 505/0 0 0 0 0 0 0 0 | 0 |
| 611 | 504/1 0 0 0 0 0 0 0 | 1 |
| 612 | 503/1 0 1 0 0 0 0 0 | 2 |
| 613 | 502/1 0 1 0 1 0 0 0 | 3 |
| 614 | 501/1 0 1 0 1 0 1 0 | 4 |
| 615 | 502/1 0 1 0 1 0 0 0 | 3 |
| 616 | 503/1 0 1 0 0 0 0 0 | 2 |
| 617 | 504/1 0 0 0 0 0 0 0 | 1 |
| 618 | 506/0 1 0 0 0 0 0 0 | −1 |
| 619 | 507/0 1 0 1 0 0 0 0 | −2 |
| 620 | 508/0 1 0 1 0 1 0 0 | −3 |
| 621 | 509/0 1 0 1 0 1 0 1 | −4 |
| 622 | 508/0 1 0 1 0 1 0 0 | −3 |
| 623 | 507/0 1 0 1 0 0 0 0 | −2 |
| 624 | 506/0 1 0 0 0 0 0 0 | −1 |

In the above-described examples, embodiments of SMPA systems implemented uniform quantization in which an equal voltage difference exists between any two adjacent quantization states (e.g., a normalized value of 1). In other embodiments, an SMPA system may implement non-uniform quantization, meaning that unequal voltage differences (or quantization step sizes) may exist between some adjacent quantization states. For example, a quantization step size having a normalized value of 1 may exist between a first quantization state and an adjacent second quantization state, a quantization step size having a normalized value of 2 may exist between the second quantization state and an adjacent third quantization state, a quantization step size having a normalized value of 3 may exist between the third quantization state and an adjacent fourth quantization state, and so on.

Implementation of non-uniform quantization may be particularly advantageous, for example, in a system in which the voltage of an input RF signal is relatively low a significant portion of the time (e.g., in a system that supports communication using a Wideband Code Division Multiple Access (WCDMA) wireless standard, a Long Term Evolution (LTE) wireless standard, or some other air interface standard). According to an embodiment, an SMPA system is capable of switching between producing signals with uniform quantization and producing signals with non-uniform quantization. In other words, in an embodiment, an SMPA system may be configured at some times to provide uniform quantization, and may be reconfigured to provide signals with non-uniform quantization, and vice versa. According to an embodiment, selection of the configuration may be based on the type of RF signal that is being amplified by the SMPA system (e.g., based on the air interface standard used to produce the RF signal).

Non-uniform quantization is achieved in a system in which the output voltage at output 180 increases or decreases non-uniformly (e.g., in non-uniform step sizes) per the operation described in tables 200, 400, and 500 (FIGS. 2, 4, and 5) when changing the input coding from one row to an adjacent row. For example, referring to table 200, changing the input coding from row 204 to adjacent row 203 may result in an increase of 1 volt normalized at output 180, and changing the input coding from row 203 to adjacent row 204 may result in an increase of 2 volts normalized at output 180. Non-uniform quantization also may be achieved by selecting the encoded values in a manner to ensure the non-uniform quantization. In the embodiments described herein, the sizing of the PAs and the input voltages provided to each SMPA branch affect the relative contributions of each of the signals produced by the SMPA branches to the voltage of the combined output signal (e.g., at output 180). In addition, these characteristics also affect whether or not the system produces signals with uniform or non-uniform quantization. In addition or alternatively, the characteristics of the transformers (e.g., the size, turns ratios, and so on) and/or other system components (e.g., impedance lines) may be designed to enable the system to produce signals with uniform or non-uniform quantization.

According to a specific embodiment, non-uniform quantization (or different step sizes between adjacent quantization states) may be achieved by providing different DC voltage inputs (e.g., DC voltage inputs 130-132) to the SMPA branches (e.g., SMPA branches 120-122). In such an embodiment, the SMPA branches may include transformers with the same turns ratio. For example, a first DC voltage, $V_{DD1}$, provided to a first SMPA branch (e.g., SMPA branch 120) may be half of a second DC voltage, $V_{DD2}$, provided to a second SMPA branch (e.g., SMPA branch 121) and one third of a third DC voltage, $V_{DDN}$, provided to a third SMPA branch (e.g., SMPA branch 122). In other words, $V_{DD2}=2V_{DD1}$; and $V_{DD3}=3_{VDD1}$. Those of skill in the art would understand, based on the description herein, that other DC voltage ratios alternatively could be implemented. In addition, in alternate embodiments, non-uniform transformer turns ratios could be used to provide non-uniform quantization. In still other alternate embodiments, a combination of different DC input voltages and non-uniform transformer turns ratios could be used to provide non-uniform quantization. In still other alternate embodiments, although different DC voltages may be applied to the SMPA branches (e.g., SMPA branches 120-122), the PAs (e.g., PAs 123-128) may have relative sizes that result in the system providing signals with uniform quantization.

Figure 7:
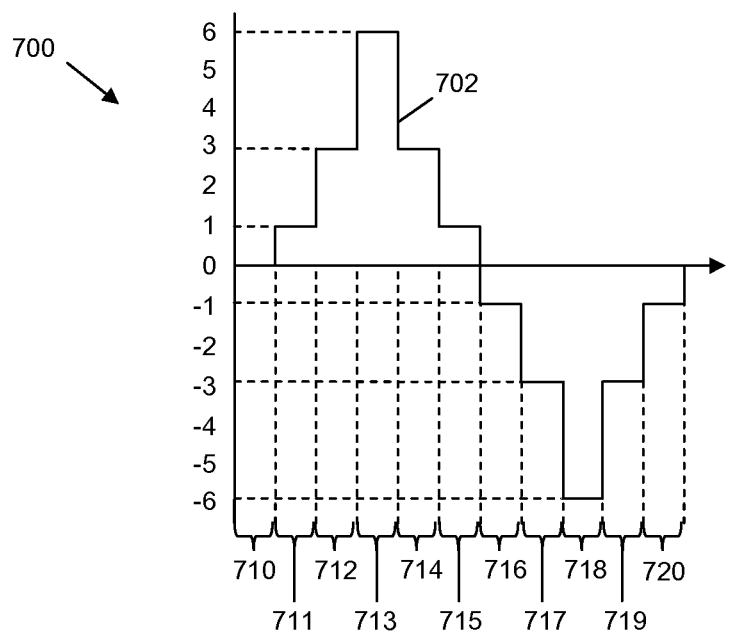
FIG. 7 is a chart illustrating seven example output voltage levels for a three-branch SMPA system that implements non-uniform quantization, in accordance with an example embodiment.

FIG. 7 is a chart 700 illustrating seven example output voltage levels for a three-branch SMPA system that implements non-uniform quantization, in accordance with an example embodiment. In chart 700, the vertical axis represents voltage level (normalized), and the horizontal axis represents time. Again, the chart 700 depicts a varying magnitude of an output signal (e.g., at output 180) when a particular sequence of encoded values (e.g., a sequence of values from the encoded values of FIG. 2) is selected by a QE module. The example assumes that $V_{DD2}=2V_{DD1}$; and $V_{DD3}=3_{VDD1}$, and consequently that the first SMPA branch 120 is producing signals with normalized voltage values of 0, 1, and −1, the second SMPA branch 121 is producing signals with normalized voltage values of 0, 2, and −2, and the third SMPA branch 122 is producing signals with normalized voltage values of 0, 3, and −3. Referring to both FIGS. 2 and 7, trace 702 of chart 700 depicts the magnitude of the output signal (e.g., at output 180) when a QE module (e.g., QE module 110) converts the sequence of encoded values in the following table into drive signals that are provided to three SMPA branches (e.g., SMPA branches 120-122), each SMPA branch produces a corresponding output signal, and a combiner (e.g., combiner 160) combines the output signals to produce a combined output signal (e.g., at output 180):

| time period (FIG. 7) | row/encoded value (FIG. 2) | normalized output voltage |
| --- | --- | --- |
| 710 | 204/0 0 0 0 0 0 | 0 |
| 711 | 203/1 0 0 0 0 0 | 1 |
| 712 | 202/1 0 1 0 0 0 | 3 |
| 713 | 201/1 0 1 0 1 0 | 6 |
| 714 | 202/1 0 1 0 0 0 | 3 |
| 715 | 203/1 0 0 0 0 0 | 1 |
| 716 | 205/0 1 0 0 0 0 | −1 |
| 717 | 206/0 1 0 1 0 0 | −2 |
| 718 | 207/0 1 0 1 0 1 | −3 |
| 719 | 206/0 1 0 1 0 0 | −2 |
| 720 | 205/0 1 0 0 0 0 | −1 |

In the above-given examples, in the output combiner 160, phase transformers 165, 166 are present between each of the SMPA branches 120-122. In an alternate embodiment, a system may include "parallel" SMPA branches, in which no phase transformers are present between the parallel SMPA branches. For example, FIG. 8 is a simplified schematic diagram of multiple-state SMPA system 800, in accordance with another example embodiment in which no phase transformer is present between the outputs of at least two parallel SMPA branches (e.g., SMPA branches 822 and 824).

Figure 8:
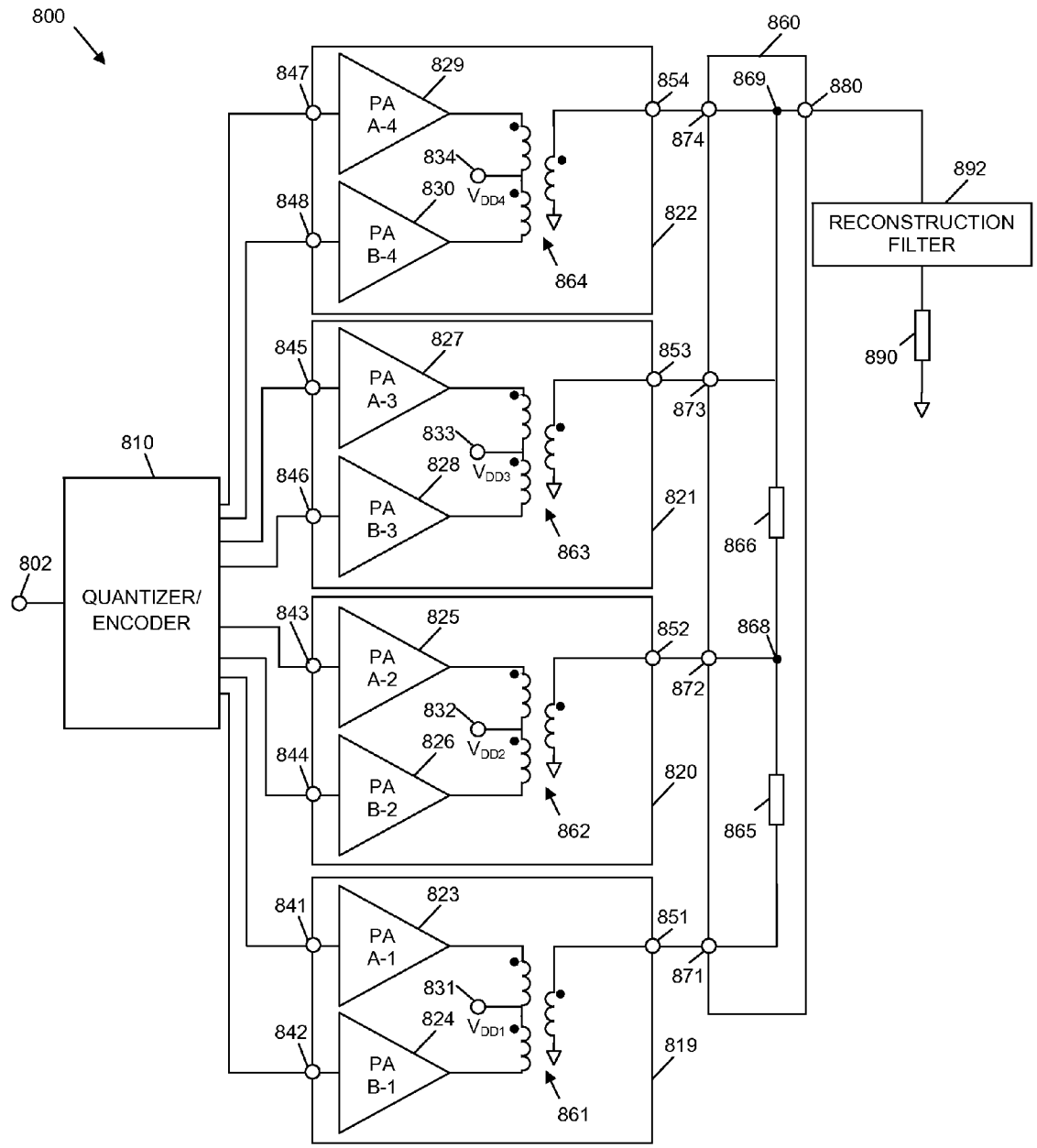
FIG. 8 is a simplified schematic diagram of multiple-state SMPA system, in accordance with another example embodiment.

SMPA system 800 of FIG. 8 is similar to SMPA system 100 of FIG. 1 in that SMPA system 800 also includes a QE module 810, multiple SMPA branches 819, 820, 821, 822, an output combiner 860, and a reconstruction filter 892 that may be coupled to a load 890. SMPA system 800 differs from SMPA system 100, however, in that SMPA system 800 includes two SMPA branches 821, 822 that are in parallel with each other with no phase transformer coupled between their outputs.

According to an embodiment, the parallel SMPA branches 821, 822 are configured to produce output signals that make contributions of different magnitudes to a combined output signal (e.g., at output 890). For example, SMPA branch 821 may be configured to produce output signals that contribute a normalized voltage increase of +1, 0, or −1 to the combined output signal, and SMPA branch 822 may be configured to produce output signals that contribute a normalized voltage increase of +2, 0, or −2 to the combined output signal. The different contributions from the parallel SMPA branches 821, 822 may be achieved by sizing the PAs 827-830 of the SMPA branches 821, 822 differently, by providing the SMPA branches 821, 822 with different DC voltages $V_{DD3}$, $V_{DD4}$, by implementing a combination of these techniques, and/or by using other techniques. In any event, by providing parallel SMPA branches 821, 822 that produce output signals that provide different contributions to the combined output signal, system 800 may be able to produce an output signal with nine quantization states (e.g., as depicted in FIG. 6).

Similar to QE module 110, QE module 810 is configured to receive an RF input signal at input node 802, to sample the signal in order to produce a sequence of samples, to quantize the samples to produce a sequence of quantized digital values, and to encode each quantized digital value in order to produce a multi-bit encoded value in which each bit corresponds to a drive signal for a distinct one of the system's PAs 823-830. Accordingly, in system 800, which includes four SMPA branches 819-822 and eight corresponding PAs 823-830, each encoded value may include at least eight bits. The drive signals corresponding to each encoded value are provided substantially in parallel to drive signal inputs 841-848 of SMPA branches 819-822. However, a PA 827-830 of only one of the parallel SMPA branches 821, 822 is driven into saturation at any given time, according to an embodiment. The PAs 827-830 of the other parallel SMPA branch 821, 822 would be inactive at that time. Accordingly, only one of the PAs 827-830 of the parallel SMPA branches 821, 822 may produce a significant positive or negative output signal at any given time. According to an embodiment, the drive signals may have phase offsets when provided to the drive signal inputs 841-848, in order to compensate for phase shifts later applied by phase transformers 865, 866, and phase shifts arising within the output combiner 860.

According to an embodiment, each SMPA branch 819-822 has a class D amplifier structure. More specifically, each SMPA branch 819-822 includes a complementary pair of PAs (i.e., pair 823, 824, pair 825, 826, pair 827, 828, and pair 829, 830) and a transformer 861, 862, 863, 864, the functionality and operation of which is substantially similar to the PAs 123-128 and transformers 162-164 of FIG. 1. Each SMPA branch 819-822 is coupled between a pair of drive signal inputs 841, 842, 843, 844, 845, 846, 847, 848 and an SMPA branch output 851-854. In addition, each SMPA branch 819-822 receives a DC voltage, $V_{DD}$, through a DC voltage input 831, 832, 833, 834. The magnitudes of the input DC voltages may be substantially equal (e.g., $V_{DD1}=V_{DD2}=V_{DD4}$), in an embodiment, or the magnitudes of the input DC voltages may be different from each other, in other embodiments. Although FIG. 8 illustrates a particular class D amplifier topology that may be used in conjunction with the SMPA system 800 illustrated in FIG. 8, those of skill in the art would understand, based on the description herein, that other class D amplifier topologies alternatively could be used. In addition, the SMPA system 800 alternatively may utilize class E amplifier topologies or other types of switching amplifiers.

SMPA system 800 also includes an output combiner 860. The output combiner 860 includes a plurality of inputs 871, 872, 873, 874, each coupled to one of the SMPA branch outputs 851-854 of the SMPA branches 819-822. The output combiner 860 is configured to combine the signals received from the SMPA branches 819-822 via the SMPA branch outputs 851-854 and combiner inputs 871-874, in order to produce a combined output signal at output 880. The combined output signal is provided to reconstruction filter 892, in an embodiment, which includes a band-pass filter configured to bandlimit the combined output signal (e.g., to produce a smoother output analog RF signal by filtering out the out-of-band spectral content). When the reconstruction filter 892 is coupled to a load 890, as shown in FIG. 8, the reconstructed output signal produced by the reconstruction filter 892 is provided to the load 890.

According to an embodiment, output combiner 860 includes a number of summing nodes 868, 869 and a number of phase transformers 865, 866, which may be coupled to the combiner inputs 871-874 as indicated in FIG. 8. In contrast to the system 100 of FIG. 1, the number of summing nodes 868, 869 and the number of phase transformers 865, 866 is less than N-1. More specifically, the outputs of some of the SMPA branches, specifically parallel SMPA branches 821 and 822 do not have a phase transformer coupled between them.

In the illustrated embodiment, the first SMPA branch 819 is coupled (via output 851 and input 871) to a first terminal of a first phase transformer 865, and the second SMPA branch 820 is coupled (via output 852 and input 872) to summing node 868, a second terminal of the first phase transformer 865, and a first terminal of a second phase transformer 866. The third and fourth SMPA branches 821, 822 are coupled (via outputs 853, 854 and inputs 873, 874) to summing node 869 and a second terminal of the second phase transformer 866. Further, summing node 869 is coupled to output 880.

Phase transformers 865, 866 may be quarter wave (lambda/4) phase transformers, for example, although in other embodiments, phase transformers 865, 866 may be configured to introduce larger or smaller phase delays. In addition to producing a phase shift, phase transformers 865, 866 may also be configured to produce impedance transformations between input 871 and summing node 868, and between summing nodes 868 and 869, respectively. Either way, the phasing of the drive signals provided to the SMPA branches 819-822 at drive signal inputs 841-848 is controlled so that signals received at summing nodes 868, 869 from different SMPA branches 819-822 will be added together in phase. For example, in an embodiment in which phase transformers 865, 866 are quarter wave transformers, QE module 810 provides drive signals corresponding to a particular encoded value (or to a particular sample or quantized digital value) to SMPA branch 819 90 degrees ahead of the drive signals provided to SMPA branch 820, and 180 degrees ahead of drive signals provided to SMPA branches 821 and 822. Accordingly, the output signal from SMPA branch 819 will be delayed by phase transformer 865 by 90 degrees, thus allowing that output signal to arrive at summing node 868 in phase with the output signal from SMPA branch 820. The combined signal at summing node 868 is again delayed by phase transformer 866 by another 90 degrees, thus allowing the combined signal from summing node 868 to arrive at summing node 869 in phase with the output signals from SMPA branches 821 and 822. In this manner, the output signals from all of the SMPA branches 819-822 ultimately are combined in phase with each other.

Although FIG. 8 illustrates SMPA system 800 as including four SMPA branches 819-822 with two of the SMPA branches 821, 822 being in parallel (i.e., with no intervening phase transformer coupled between their outputs), it is to be understood that other embodiments of SMPA systems may include as more or less than four SMPA branches, and/or more SMPA branches in parallel. For example, in an alternate embodiment, a system could include three or more parallel SMPA branches, and/or a system may include multiple sets of parallel SMPA branches. In addition, in various embodiments, SMPA system 800 may provide uniform or non-uniform quantization using techniques such as those previously described.

FIG. 9 is a table 900 illustrating an example of amplifier control bit codes which, when provided to an embodiment of a four-branch SMPA system with eight PAs and two parallel SMPA branches (e.g., SMPA system 800, FIG. 8), cause the SMPA system to amplitude modulate its output signal to one of nine output voltage levels with uniform quantization.

Table 900 includes nine rows 901, 902, 903, 904, 905, 906, 907, 908, 909, where each row corresponds to one of nine quantization states (e.g., quantization states ranging from values of −4 to +4 in step sizes of 1). In addition, the table 900 includes eight columns 911, 912, 913, 914, 915, 916, 917, 918, where each column corresponds to one bit of an eight-bit encoded value, and the value of each bit determines the state of a drive signal that will be provided to one of the eight PAs of the system. By way of example, column 911 may correspond to PA 823, column 912 may correspond to PA 824, column 913 may correspond to PA 825, column 914 may correspond to PA 826, column 915 may correspond to PA 827, column 916 may correspond to PA 828, column 917 may correspond to PA 829, and column 918 may correspond to PA 830.

Each row 901-909 includes one of nine unique encoded values, and each of the encoded values, when selected by the QE module and used to produce drive signals for the PAs, will cause the system to produce an output signal (e.g., at output 880) having one of nine different normalized voltage levels or states. For example, in table 900, encoded value "1 0 1 0 0 0 1 0" in row 901 may correspond to a highest quantization state (e.g., a positive voltage level of +4), encoded value "1 0 1 0 1 0 0 0" in row 902 may correspond to a next highest quantization state (e.g., a positive voltage level of +3), and so on. These two specific states include states in which one or the other of the two parallel SMPA branches 821, 822 is producing a positive output signal. Again, as discussed above, in an embodiment in which parallel SMPA branches are implemented, a PA of only one of the parallel SMPA branches should be driven into saturation at any given time. The example coding scheme depicted in FIG. 9 corresponds to such an embodiment.

Figure 10:
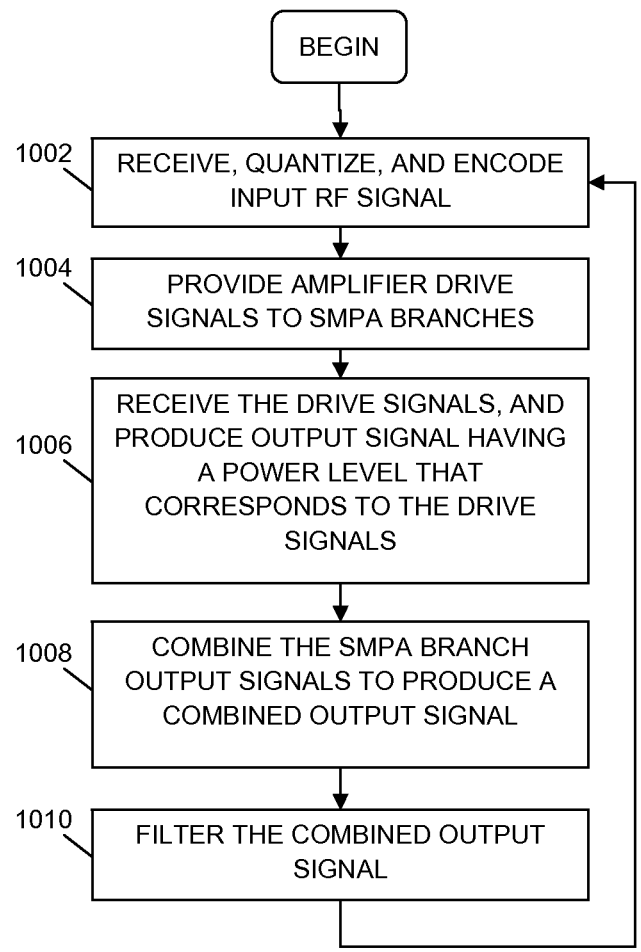
FIG. 10 is a flowchart of a method for operating a multiple-state SMPA system, in accordance with an example embodiment.

FIG. 10 is a flowchart of a method for operating a multiple-state SMPA system (e.g., SMPA systems 100, 800, FIGS. 1, 8), in accordance with an example embodiment. The method may begin, in block 1002, when the SMPA system receives an RF signal. For example, referring also to FIGS. 1 and 8, a QE module (e.g., QE module 110, 810) may receive an RF signal provided at an input node (e.g., input node 102, 802). The SMPA system (or more particularly, the QE module) may then sample the input RF signal, quantize the samples, and encode the quantized digital values. For example, as discussed previously, the SMPA system may periodically measure the magnitude of the input signal, and produce samples (at a sampling rate) that indicate the measured magnitudes. The SMPA system may then quantize each sample in order to produce a quantized digital value, and encode each quantized digital value in order to produce a multi-bit encoded value in which each bit corresponds to a drive signal for a distinct one of the system's PAs (e.g., PAs 123-128, 823-830). In some cases, the samples, quantized digital values, and/or the encoded values may be buffered.

In block 1004, the SMPA system (e.g., the QE module) may then produce amplifier drive signals based on each encoded value, and may provide the drive signals to the PAs of the system's SMPA branches (e.g., to PAs 123-128, 823-830 of SMPA branches 120-122, 819-822). As discussed previously, the state of each amplifier drive signal at any given time depends on the state of the encoded value bit that corresponds to each amplifier (e.g., the state of the drive signal is either $S_{OFF}$ or $S_{ON}$, depending on whether the bit is "0" or "1"). As also discussed previously, the amplifier drive signals may be provided to the amplifiers with phase offsets that ensure that, ultimately, the amplified RF signals are combined (e.g., by output combiner 160, 860) in phase.

In block 1006, the PAs of the system's SMPA branches (e.g., to PAs 123-128, 823-830 of SMPA branches 120-122, 819-822) receive the drive signals, and each SMPA branch produces an output signal that has a voltage level that corresponds to the drive signals. In block 1008, the output signals produced by the SMPA branches are combined in phase (e.g., by output combiner 160, 860), in order to produce a combined output signal (e.g., at output 180, 880). As discussed previously, the combined output signal may be uniformly or non-uniformly quantized. The combined output signal may then be filtered (e.g., by reconstruction filter 192, 892), in block 1010, in order to bandlimit the combined output signal. Finally, the reconstructed output signal may be provided to a load (e.g., load 190, 890). The method may be continuously performed as long as the SMPA system continues to operate.

An embodiment of an amplifier includes a number, N, of SMPA branches. The SMPA branches include at least a first SMPA branch and a second SMPA branch. The first SMPA branch includes two first drive signal inputs, and a first SMPA branch output. In response to receiving a first combination of drive signals at the two first drive signal inputs, the first SMPA branch is configured to produce, at the first SMPA branch output, a first SMPA branch output signal at a first voltage level. In response to receiving a different second combination of drive signals at the two first drive signal inputs, the first SMPA branch is configured to produce, at the first SMPA branch output, the first SMPA branch output signal at a different second voltage level. The second SMPA branch includes two second drive signal inputs, and a second SMPA branch output. In response to receiving the first combination of drive signals at the two second drive signal inputs, the second SMPA branch is configured to produce, at the second SMPA branch output, a second SMPA branch output signal at a different third voltage level. In response to receiving the different second combination of drive signals at the two second drive signal inputs, the second SMPA branch is configured to produce, at the second SMPA branch output, the second SMPA branch output signal at a different fourth voltage level.

Another embodiment of an amplifier includes NSMPA branches, a combiner, and a module with an RF signal input and 2*N drive signal outputs, where N is greater than one. The module is configured to receive an input RF signal at the RF signal input, to sample the input RF signal, resulting in a sequence of samples, and to provide, at the 2*N drive signal outputs, drive signals to each of the N SMPA branches. The states of the drive signals at any given time depend on the magnitude of a sample that is being processed by the module. The SMPA branches include at least a first SMPA branch and a second SMPA branch. The first SMPA branch includes two first drive signal inputs, and a first SMPA branch output. In response to receiving a first combination of drive signals at the two first drive signal inputs, the first SMPA branch is configured to produce, at the first SMPA branch output, a first SMPA branch output signal at a first voltage level. In response to receiving a different second combination of drive signals at the two first drive signal inputs, the first SMPA branch is configured to produce, at the first SMPA branch output, the first SMPA branch output signal at a different second voltage level. The second SMPA branch includes two second drive signal inputs, and a second SMPA branch output. In response to receiving the first combination of drive signals at the two second drive signal inputs, the second SMPA branch is configured to produce, at the second SMPA branch output, a second SMPA branch output signal at a different third voltage level. In response to receiving the different second combination of drive signals at the two second drive signal inputs, the second SMPA branch is configured to produce, at the second SMPA branch output, the second SMPA branch output signal at a different fourth voltage level. The combiner has N combiner inputs and a combiner output. Each of the combiner inputs is coupled to a different one of N SMPA branch outputs from the N SMPA branches, and the combiner is configured to combine together the SMPA branch output signal from all of the N SMPA branches to produce, at the combiner output, a combined output signal. The combined output signal may have, at any given time, one of 2*N+1 quantization states.

An embodiment of a method, performed by an amplifier, for amplifying a time varying signal, includes the step of receiving combinations of drive signals by a number, N, of SMPA branches of the amplifier, where N is greater than one, and where each SMPA branch includes two drive signal inputs, so that the amplifier has a total of 2*N drive signal inputs, and one SMPA branch output, so that the amplifier has a total of N SMPA branch outputs. The method further includes, in response to receiving a first combination of drive signals at two first drive signal inputs of a first SMPA branch, producing, by the first SMPA branch at a first SMPA branch output, a first SMPA branch output signal at a first voltage level. The method further includes, in response to receiving a different second combination of drive signals at the two first drive signal inputs, producing, by the first SMPA branch at the first SMPA branch output, the first SMPA branch output signal at a different second voltage level. The method further includes, in response to receiving the first combination of drive signals at two second drive signal inputs of a second SMPA branch, producing, by the second SMPA branch at a second SMPA branch output, a second SMPA branch output signal at a different third voltage level. The method further includes, in response to receiving the second combination of drive signals at the two second drive signal inputs, producing, by the second SMPA branch at the second SMPA branch output, the second SMPA branch output signal at a different fourth voltage level.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus. The term "coupled," as used herein, is defined as directly or indirectly connected in an electrical or non-electrical manner.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:
1. An amplifier comprising:
   a number, N, of switch-mode power amplifier (SMPA) branches, wherein the SMPA branches include at least:
   a first SMPA branch that includes
      two first drive signal inputs, and
      a first SMPA branch output, wherein
      in response to receiving a first combination of drive signals at the two first drive signal inputs, the first SMPA branch is configured to produce, at the first SMPA branch output, a first SMPA branch output signal at a first voltage level, and
      in response to receiving a different second combination of drive signals at the two first drive signal inputs, the first SMPA branch is configured to produce, at the first SMPA branch output, the first SMPA branch output signal at a different second voltage level;
   a second SMPA branch that includes
      two second drive signal inputs, and
      a second SMPA branch output, wherein
      in response to receiving the first combination of drive signals at the two second drive signal inputs, the second SMPA branch is configured to produce, at the second SMPA branch output, a second SMPA branch output signal at a different third voltage level, and
      in response to receiving the different second combination of drive signals at the two second drive signal inputs, the second SMPA branch is configured to produce, at the second SMPA branch output, the second SMPA branch output signal at a different fourth voltage level; and
   a module with a radio frequency (RF) signal input and 2*N drive signal outputs, wherein each drive signal output is coupled to a different one of the 2*N drive signal inputs, and wherein the module is configured to receive an input RF signal at the RF signal input, to sample the input RF signal, resulting in a sequence of samples, and to provide, at the 2*N drive signal outputs, the drive signals to each of the N SMPA branches, wherein the states of the drive signals at any given time depend on the magnitude of a sample that is being processed by the module.
2. The amplifier of claim 1, wherein:
   the first and second SMPA branches are controlled so that only one of the first and second SMPA branches outputs a non-zero SMPA branch output signal at a time; and the N SMPA branches further comprise a third SMPA branch that includes
two third drive signal inputs, and
a third SMPA branch output, wherein
in response to receiving the first combination of drive signals at the two third drive signal inputs, the third SMPA branch is configured to produce, at the third SMPA branch output, a third SMPA branch output signal at the first voltage level, and
in response to receiving the different second combination of drive signals at the two third drive signal inputs, the third SMPA branch is configured to produce, at the third SMPA branch output, the third SMPA branch output signal at the second voltage level.

3. The amplifier of claim 2, further comprising:
a combiner with N combiner inputs, a combiner output, a summing node, and a phase transformer, wherein
each of the combiner inputs is coupled to a different SMPA branch output of one of the N SMPA branches, and the combiner is configured to combine together the SMPA branch output signal from all of the N SMPA branches to produce, at the combiner output, a combined output signal,
the first and second SMPA branch outputs are coupled to the summing node,
the summing node is coupled to the combiner output,
a first terminal of the phase transformer is coupled to the summing node, and
a second terminal of the phase transformer is coupled to the third SMPA branch output, and wherein the phase transformer is configured to apply a phase delay to the third SMPA branch output signal so that the third SMPA branch output signal combines in phase at the summing node to with the first SMPA branch output signal and the second SMPA branch output signal.

4. The amplifier of claim 3, further comprising:
a reconstruction filter coupled to the combiner output, wherein the reconstruction filter is configured to bandpass filter the combined output signal.

5. The amplifier of claim 2,
wherein the module provides the drive signals so that only one of the first and second SMPA branches outputs a non-zero SMPA branch output signal at any given time.

6. The amplifier of claim 5, wherein the module provides the drive signals so that the combiner will produce the combined output signal as a signal that is, at any given time, at one of 2*N+1 non-uniform quantization states.

7. The amplifier of claim 5, wherein the module provides the drive signals so that the combiner will produce the combined output signal as a signal that is, at any given time, at one of 2*N+1 uniform quantization states.

8. The amplifier of claim 1, wherein:
the first SMPA branch comprises a first SMPA, a second SMPA, and a first tapped transformer, wherein an input of the first SMPAs is coupled to one of the two first drive signal inputs, an input of the second SMPA is coupled to another one of the two first drive signal inputs, an output of the first SMPA is coupled to a first end of a first coil of the first tapped transformer, an output of the second SMPA is coupled to a second end of the first coil of the first tapped transformer, a first DC voltage is coupled to a tap of the first coil of the first tapped transformer, and a second coil of the first tapped transformer is coupled to the first SMPA branch output; and
the second SMPA branch comprises a third SMPA, a fourth SMPA, and a second tapped transformer, wherein an input of the third SMPAs is coupled to one of the two second drive signal inputs, an input of the fourth SMPA is coupled to another one of the two second drive signal inputs, an output of the third SMPA is coupled to a first end of a first coil of the second tapped transformer, an output of the fourth SMPA is coupled to a second end of the first coil of the second tapped transformer, a second DC voltage that is different from the first DC voltage is coupled to a tap of the first coil of the second tapped transformer, and a second coil of the second tapped transformer is coupled to the second SMPA branch output.

9. The amplifier of claim 1, wherein the first voltage level has a smaller absolute magnitude than the third voltage level, the second voltage level has a smaller absolute magnitude than the fourth voltage level, and the smaller absolute magnitudes are achieved by selecting one or more of a particular size ratio between SMPAs of the first and second SMPA branches, different DC voltages provided to the first and second SMPA branches, and a particular turns ratio for transformers of the first and second SMPA branches.

10. An amplifier comprising:
a module with a radio frequency (RF) signal input and 2*N drive signal outputs, wherein N is greater than one, and wherein the module is configured to receive an input RF signal at the RF signal input, to sample the input RF signal, resulting in a sequence of samples, and to provide, at the 2*N drive signal outputs, drive signals to each of N switch-mode power amplifier (SMPA) branches, wherein the states of the drive signals at any given time depend on the magnitude of a sample that is being processed by the module;
the N SMPA branches, wherein the SMPA branches include at least:
a first SMPA branch that includes
two first drive signal inputs, and
a first SMPA branch output, wherein
in response to receiving a first combination of drive signals at the two first drive signal inputs, the first SMPA branch is configured to produce, at the first SMPA branch output, a first SMPA branch output signal at a first voltage level, and
in response to receiving a different second combination of drive signals at the two first drive signal inputs, the first SMPA branch is configured to produce, at the first SMPA branch output, the first SMPA branch output signal at a different second voltage level; and
a second SMPA branch that includes
two second drive signal inputs, and
a second SMPA branch output, wherein
in response to receiving the first combination of drive signals at the two second drive signal inputs, the second SMPA branch is configured to produce, at the second SMPA branch output, a second SMPA branch output signal at a different third voltage level, and
in response to receiving the different second combination of drive signals at the two second drive signal inputs, the second SMPA branch is configured to produce, at the second SMPA branch output, the second SMPA branch output signal at a different fourth voltage level; and
a combiner with N combiner inputs and a combiner output, wherein each of the combiner inputs is coupled to a different one of N SMPA branch outputs from the N SMPA branches, and the combiner is configured to combine together the SMPA branch output signal from all of the N SMPA branches to produce, at the combiner output, a combined output signal, wherein the combined output signal may have, at any given time, one of 2*N+1 quantization states.

11. The amplifier of claim 10, wherein:
the first and second SMPA branches are controlled so that only one of the first and second SMPA branches outputs a non-zero SMPA branch output signal at a time; and
the N SMPA branches further comprise a third SMPA branch that includes
two third drive signal inputs, and
a third SMPA branch output, wherein
in response to receiving the first combination of drive signals at the two third drive signal inputs, the third SMPA branch is configured to produce, at the third SMPA branch output, a third SMPA branch output signal at the first voltage level, and
in response to receiving the different second combination of drive signals at the two third drive signal inputs, the third SMPA branch is configured to produce, at the third SMPA branch output, the third SMPA branch output signal at the second voltage level.

12. The amplifier of claim 11, wherein:
the combiner further comprises a summing node and a phase transformer,
the first and second SMPA branch outputs are coupled to the summing node,
the summing node is coupled to the combiner output,
a first terminal of the phase transformer is coupled to the summing node, and
a second terminal of the phase transformer is coupled to the third SMPA branch output, and wherein the phase transformer is configured to apply a phase delay to the third SMPA branch output signal so that the third SMPA branch output signal combines in phase at the summing node to with the first SMPA branch output signal and the second SMPA branch output signal.

13. The amplifier of claim 10, wherein the module provides the drive signals so that only one of the first and second SMPA branches outputs a non-zero SMPA branch output signal at any given time.

14. The amplifier of claim 10, wherein the module provides the drive signals so that the combiner will produce the combined output signal as a signal that is, at any given time, at one of 2*N+1 non-uniform quantization states.

15. The amplifier of claim 10, wherein the module provides the drive signals so that the combiner will produce the combined output signal as a signal that is, at any given time, at one of 2*N+1 uniform quantization states.

16. An amplifier comprising:
a module with a radio frequency (RF) signal input and 2*N drive signal outputs, wherein N is greater than one, and wherein the module is configured to receive an input RF signal at the RF signal input, to sample the input RF signal, resulting in a sequence of samples, and to provide, at the 2*N drive signal outputs, drive signals to each of N switch-mode power amplifier (SMPA) branches, wherein the states of the drive signals at any given time depend on the magnitude of a sample that is being processed by the module;
the N SMPA branches, wherein the SMPA branches include at least:
a first SMPA branch that comprises
two first drive signal inputs,
a first SMPA branch output,
a first SMPA,
a second SMPA, and
a first tapped transformer, wherein an input of the first SMPAs is coupled to one of the two first drive signal inputs, an input of the second SMPA is coupled to another one of the two first drive signal inputs, an output of the first SMPA is coupled to a first end of a first coil of the first tapped transformer, an output of the second SMPA is coupled to a second end of the first coil of the first tapped transformer, a first DC voltage is coupled to a tap of the first coil of the first tapped transformer, and a second coil of the first tapped transformer is coupled to the first SMPA branch output,
wherein, in response to receiving a first combination of drive signals at the two first drive signal inputs, the first SMPA branch is configured to produce, at the first SMPA branch output, a first SMPA branch output signal at a first voltage level, and
in response to receiving a different second combination of drive signals at the two first drive signal inputs, the first SMPA branch is configured to produce, at the first SMPA branch output, the first SMPA branch output signal at a different second voltage level, and
a second SMPA branch that comprises
two second drive signal inputs,
a second SMPA branch output,
a third SMPA,
a fourth SMPA, and
a second tapped transformer, wherein an input of the third SMPAs is coupled to one of the two second drive signal inputs, an input of the fourth SMPA is coupled to another one of the two second drive signal inputs, an output of the third SMPA is coupled to a first end of a first coil of the second tapped transformer, an output of the fourth SMPA is coupled to a second end of the first coil of the second tapped transformer, a second DC voltage that is different from the first DC voltage is coupled to a tap of the first coil of the second tapped transformer, and a second coil of the second tapped transformer is coupled to the second SMPA branch output,
wherein, in response to receiving the first combination of drive signals at the two second drive signal inputs, the second SMPA branch is configured to produce, at the second SMPA branch output, a second SMPA branch output signal at a different third voltage level, and
in response to receiving the different second combination of drive signals at the two second drive signal inputs, the second SMPA branch is configured to produce, at the second SMPA branch output, the second SMPA branch output signal at a different fourth voltage level; and
a combiner with N combiner inputs and a combiner output, wherein each of the combiner inputs is coupled to a different one of N SMPA branch outputs from the N SMPA branches, and the combiner is configured to combine together the SMPA branch output signal from all of the N SMPA branches to produce, at the combiner output, a combined output signal, wherein the combined output signal may have, at any given time, one of 2*N+1 quantization states.

17. An amplifier comprising:
a module with a radio frequency (RF) signal input and 2*N drive signal outputs, wherein N is greater than one, and wherein the module is configured to receive an input RF signal at the RF signal input, to sample the input RF signal, resulting in a sequence of samples, and to provide, at the 2*N drive signal outputs, drive signals to each of N switch-mode power amplifier (SMPA) branches, wherein the states of the drive signals at any given time depend on the magnitude of a sample that is being processed by the module;

the N SMPA branches, wherein the SMPA branches include at least:

a first SMPA branch that includes
- two first drive signal inputs, and
- a first SMPA branch output, wherein
  - in response to receiving a first combination of drive signals at the two first drive signal inputs, the first SMPA branch is configured to produce, at the first SMPA branch output, a first SMPA branch output signal at a first voltage level, and
  - in response to receiving a different second combination of drive signals at the two first drive signal inputs, the first SMPA branch is configured to produce, at the first SMPA branch output, the first SMPA branch output signal at a different second voltage level, and a second SMPA branch that includes
- two second drive signal inputs, and
- a second SMPA branch output, wherein
  - in response to receiving the first combination of drive signals at the two second drive signal inputs, the second SMPA branch is configured to produce, at the second SMPA branch output, a second SMPA branch output signal at a different third voltage level, and
  - in response to receiving the different second combination of drive signals at the two second drive signal inputs, the second SMPA branch is configured to produce, at the second SMPA branch output, the second SMPA branch output signal at a different fourth voltage level, wherein the first voltage level has a smaller absolute magnitude than the third voltage level, the second voltage level has a smaller absolute magnitude than the fourth voltage level, and the smaller absolute magnitudes are achieved by selecting one or more of a particular size ratio between SMPAs of the first and second SMPA branches, different DC voltages provided to the first and second SMPA branches, and a particular turns ratio for transformers of the first and second SMPA branches; and a combiner with N combiner inputs and a combiner output, wherein each of the combiner inputs is coupled to a different one of N SMPA branch outputs from the N SMPA branches, and the combiner is configured to combine together the SMPA branch output signal from all of the N SMPA branches to produce, at the combiner output, a combined output signal, wherein the combined output signal may have, at any given time, one of 2*N+1 quantization states.

18. A method, performed by an amplifier, for amplifying a time varying signal, the method comprising the steps of:

receiving, by a module with a radio frequency (RF) signal input and 2*N drive signal outputs, an input RF signal at the RF signal input sampling the input RF signal, resulting in a sequence of samples;

providing, at the 2*N drive signal outputs, drive signals to each of a number, N, of switch-mode power amplifier (SMPA) branches of the amplifier, wherein N is greater than one, and wherein the states of the drive signals at any given time depend on the magnitude of a sample that is being processed by the module;

receiving combinations of the drive signals by the N SMPA branches of the amplifier, wherein each SMPA branch includes two drive signal inputs each coupled to a different one of the 2*N drive signal outputs, so that the amplifier has a total of 2*N drive signal inputs, and one SMPA branch output, and so that the amplifier has a total of N SMPA branch outputs;

in response to receiving a first combination of drive signals at two first drive signal inputs of a first SMPA branch, producing, by the first SMPA branch at a first SMPA branch output, a first SMPA branch output signal at a first voltage level;

in response to receiving a different second combination of drive signals at the two first drive signal inputs, producing, by the first SMPA branch at the first SMPA branch output, the first SMPA branch output signal at a different second voltage level;

in response to receiving the first combination of drive signals at two second drive signal inputs of a second SMPA branch, producing, by the second SMPA branch at a second SMPA branch output, a second SMPA branch output signal at a different third voltage level; and in response to receiving the second combination of drive signals at the two second drive signal inputs, producing, by the second SMPA branch at the second SMPA branch output, the second SMPA branch output signal at a different fourth voltage level.

19. The method of claim 18, wherein the drive signals are provided so that only one of the first and second SMPA branches outputs a non-zero SMPA branch output signal at any given time.

20. The method of claim 19, further comprising:

combining the first and second SMPA branch output signals to produce a combined output signal, wherein the combinations of drive signals are provided so that the amplifier will produce the combined output signal as a signal that is, at any given time, at one of 2*N+1 non-uniform quantization states.

21. The method of claim 19, further comprising:

combining the first and second SMPA branch output signals to produce a combined output signal, wherein the combinations of drive signals are provided so that the amplifier will produce the combined output signal as a signal that is, at any given time, at one of 2*N+1 uniform quantization states.

* * * * *